(12) United States Patent
Meder

(10) Patent No.: US 6,254,689 B1
(45) Date of Patent: Jul. 3, 2001

(54) SYSTEM AND METHOD FOR FLASH PHOTOLYSIS CLEANING OF A SEMICONDUCTOR PROCESSING CHAMBER

(75) Inventor: Martin G. Meder, Catasauqua, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/264,918

(22) Filed: Mar. 9, 1999

(51) Int. Cl.$^7$ ........................................................ B08B 7/00
(52) U.S. Cl. ........................... 134/1; 134/1.3; 438/905; 156/345
(58) Field of Search ........................... 134/1, 1.3, 22.1, 134/34; 438/905; 156/345

(56) References Cited

U.S. PATENT DOCUMENTS

| | | | |
|---|---|---|---|
| 3,890,176 | * 6/1975 | Bolon | 134/31 |
| 4,885,047 | * 12/1989 | Ury et al. | 134/1 |
| 5,215,592 | * 6/1993 | Jackson | 134/1 |
| 5,236,602 | 8/1993 | Jackson . | |
| 5,269,850 | 12/1993 | Jackson . | |
| 5,344,493 | * 9/1994 | Jackson | 134/1 |
| 5,417,826 | 5/1995 | Blalock . | |
| 5,486,235 | 1/1996 | Ye et al. . | |
| 5,578,131 | 11/1996 | Ye et al. . | |
| 5,622,565 | 4/1997 | Ye et al. . | |
| 5,676,759 | 10/1997 | Ye et al. . | |
| 5,685,916 | 11/1997 | Ye et al. . | |
| 5,709,754 | * 1/1998 | Morinville et al. | 134/1 |
| 5,753,137 | 5/1998 | Ye et al. . | |
| 5,756,400 | 5/1998 | Ye et al. . | |
| 5,788,799 | 8/1998 | Steger et al. . | |
| 5,830,279 | 11/1998 | Hackenberg . | |
| 6,098,637 | * 8/2000 | Parke | 134/1.1 |

* cited by examiner

*Primary Examiner*—Randy Gulakowski
*Assistant Examiner*—Saeed Chaudhry

(57) ABSTRACT

A method for flash photolysis cleaning are used to remove photoresist contamination from semiconductor processing chambers. During semiconductor processing, such as etching and stripping, photoresist contamination deposits on the surfaces inside the processing chamber. As more and more semiconductor wafers are processed, the photoresist contamination accumulates and this buildup on the surfaces inside the chamber is the source of particulate contaminants which are damaging to the semiconductor devices processed in the chamber. By using ultraviolet radiation (UV), a reactive agent is generated from the incoming gas flow concurrently with the preferential heating of the photoresist contamination. By flowing oxygen into the semiconductor processing chamber and exposing the oxygen to UV, the highly reactive agent ozone is produced. The reactive agent reacts with the heated photoresist to produce volatile products that are removed from the chamber in the exiting gas flow. A detector is used downstream to determine when sufficient cleaning has occurred and the cleaning process is complete.

15 Claims, 2 Drawing Sheets

SYSTEM AND METHOD FOR FLASH PHOTOLYSIS CLEANING OF A SEMICONDUCTOR PROCESSING CHAMBER

BACKGROUND OF THE INVENTION

The invention disclosed herein relates generally to a system and method of cleaning the chambers of semiconductor processing tools. More particularly, the present invention relates to a system and method of cleaning photoresist contamination in a semiconductor processing tool chamber by flash photolysis.

Hundreds of processing steps, known to those skilled in the art, are typically required to fabricate integrated circuits on semiconductor substrates. The integrated circuits are created from multiple layers of various materials, semiconductors, oxides and metals, and are collectively referred to as a wafer. The oxide and metallic layers are patterned using photoresist masks and etching to form the integrated circuit devices.

A photoresist mask is placed onto an oxide or metallic layer and then etching is used to selectively remove portions of the layer to create the desired pattern to form the integrated circuit device. After etching, the remaining photoresist is then removed or stripped from the surface of the wafer. Etching and stripping can either be performed in the same processing chamber or in separate chambers of a processing tool. During etching and stripping, photoresist contamination deposits on the surfaces inside the processing chamber. As additional semiconductors are processed, the photoresist accumulates and this buildup on the surfaces inside the chamber is the source of particulate photoresist contaminants which are damaging to the semiconductor devices processed in the chamber. Particulate contamination has the potential to degrade the performance and reliability of the integrated circuit devices. It has become increasingly more important to prevent harmful particulate contamination as integrated circuit devices have become increasingly smaller and correspondingly more sensitive to such contamination.

To prevent this damaging particulate contamination, etching and stripping processing chambers must be cleaned periodically to remove the photoresist deposits on the inside surfaces of the chamber before the deposits begin flaking and peeling and the particulate contamination inside the chamber reaches levels that are harmful to the integrated circuit devices being processed in the chamber. Typically, processing chamber cleaning is done "off-line" and the chambers are unavailable for production use during cleaning, thus, reducing the throughput of the processing tool. There is, therefore, a need to reduce the frequency of chamber cleaning and to delay cleaning until just prior to the particulate contamination becoming damaging to the integrated circuit devices being processed.

Conventional cleaning processes to remove photoresist from the surfaces inside semiconductor processing chambers include wet cleaning and plasma cleaning. During wet cleaning, the processing chamber is disassembled and its components are cleaned by hand in water or a solvent. Accordingly, wet cleaning is both labor intensive and time consuming. Plasma cleaning techniques are less labor intensive as they use either ion bombardment or a chemical reaction to remove the deposited contamination from the inside chamber surfaces. To avoid pitting or damaging the surfaces of the chamber, typically a chemically reactive plasma is used. The plasma is selected to react with and etch the deposit while minimizing the etching of the material comprising the surfaces of the chamber, which are typically aluminum. Other semiconductor processing chamber cleaning techniques include heating the surfaces of the chamber under low pressure and using special liners or coatings. These liners and coatings act as barriers to intercept the photoresist from depositing on the chamber surfaces or as thermal control coatings to reduce the amount of the deposits or to assist in the removal process.

It is recognized that during photoresist etching and stripping, photoresist contamination deposits and accumulates on the inside surfaces of the processing chambers, which must be cleaned regularly to avoid particulate contaminants damaging the integrated circuit devices being processed in the chambers. Although various cleaning techniques are currently available in the prior art, there is a need for a cost effective, easily implemented process for cleaning the photoresist contamination from semiconductor processing chambers.

SUMMARY OF THE INVENTION

It is an object of the present invention to provide a system and method of flash photolysis cleaning of semiconductor processing chambers, that combines the use of chemical reactions with heating of the photoresist to volatilize the photoresist contamination.

It is another object of the present invention to provide a system and method of cleaning semiconductor processing chambers that uses ultraviolet (UV) radiation to concurrently generate the reactive agent and to preferentially heat the photoresist by utilizing the absorption properties of photoresist.

It is another object of the present invention to provide a system and method of cleaning semiconductor processing chambers that are cost effective and easily implemented in existing semiconductor processing tools using readily available materials.

It is another object of the present invention to make the fabrication of integrated circuit devices of increasingly smaller dimensions feasible by reducing photoresist particulate contamination in semiconductor processing chambers that can degrade performance and reliability of advanced integrated circuit devices.

It is another object of the present invention to provide a simple and less time consuming system and method of cleaning photoresist contamination in order to increase the throughput of the semiconductor processing tool by reducing chamber downtime.

It is yet another object of the present invention to provide a system and method of cleaning photoresist contamination from semiconductor processing chambers that can be used in conjunction with traditional cleaning techniques to reduce the frequency of cleaning by such traditional methods and thereby reduce downtime.

It is yet another object of the present invention to provide a system and method of cleaning semiconductor processing chambers that make it easy to determine when the chamber is sufficiently cleaned by using a detector to evaluate the gas flow exiting the chamber during cleaning.

The above and other objects are achieved by using flash photolysis to produce a chemical reaction in combination with preferential heating of the photoresist to volatilize the photoresist contamination on the inside surfaces of the semiconductor processing chamber. To provide a simple, efficient system and method of cleaning the processing chambers UV radiation both generates the reactive agent and preferentially heats the photoresist, thereby cleaning the photoresist contamination from the chamber.

UV radiation can be transmitted through a window into the processing chamber, or generated directly inside the chamber, and once inside, it is reflected by the metallic surfaces inside the chamber. However, photoresist is designed to absorb in the blue and the ultraviolet regions of the spectrum, so the photoresist deposits on the inside chamber surfaces will preferentially heat. By flowing oxygen into the chamber while exposing the chamber to UV radiation, the UV radiation will not only preferentially heat the photoresist, it will convert some of the oxygen into the highly reactive oxidizing agent ozone, which will react with the heated photoresist to convert it to volatile products that are carried by the gas flow out of the chamber. The volatilization of the photoresist produces low molecular weight volatile products such as water and carbon dioxide.

Some of the above and other objects of the present invention are also achieved by evaluating the gas flow out of chamber and thereby detecting when the cleaning process is sufficiently complete. The UV-rich discharge is generated using a UV emitter source, for example, a UV flashlamp such as a xenon photoflash lamp. The pulsed UV radiation is emitted into the chamber until no volatile products or a large quantity of unreacted agent are detected in the gas flow exiting the chamber being cleaned, thus, giving a simple technique for determining when the cleaning process is sufficiently complete. It is believed that UV radiation reacts with oxygen to form ozone which in turn is the oxidizing agent for the photoresist. Photoresist is typically composed of organic matter containing carbon and hydrogen, and the heated photoresist reacts with ozone or oxygen or both to produce volatile products comprising carbon dioxide, carbon monoxide and water vapor. For example, carbon dioxide is a volatile product generated by the reaction, so the cleaning process is continued until no or a sufficiently low amount of downstream carbon dioxide is detected. Detectors, such as carbon dioxide detectors, or detectors using gas chromatography, mass spectrometry, cold quartz crystal microbalances or infrared or near infrared spectrophotometry, can be used to evaluate the downstream gas flow. To prevent potential damage to wafers being processed in or near the chamber being cleaned, an indium-tin oxide clear, conductive coating on a quartz tube or window between the UV emitter and any wafers in the area could be used to shield the wafers from any electrostatic discharge that might originate from the UV emitter.

BRIEF DESCRIPTION OF THE DRAWINGS

The invention is illustrated in the figures of the accompanying drawings which are meant to be exemplary and not limiting, in which like references refer to like or corresponding parts, and in which.

DETAILED DESCRIPTION OF THE PREFERRED EMBODIMENTS

Figure 1:
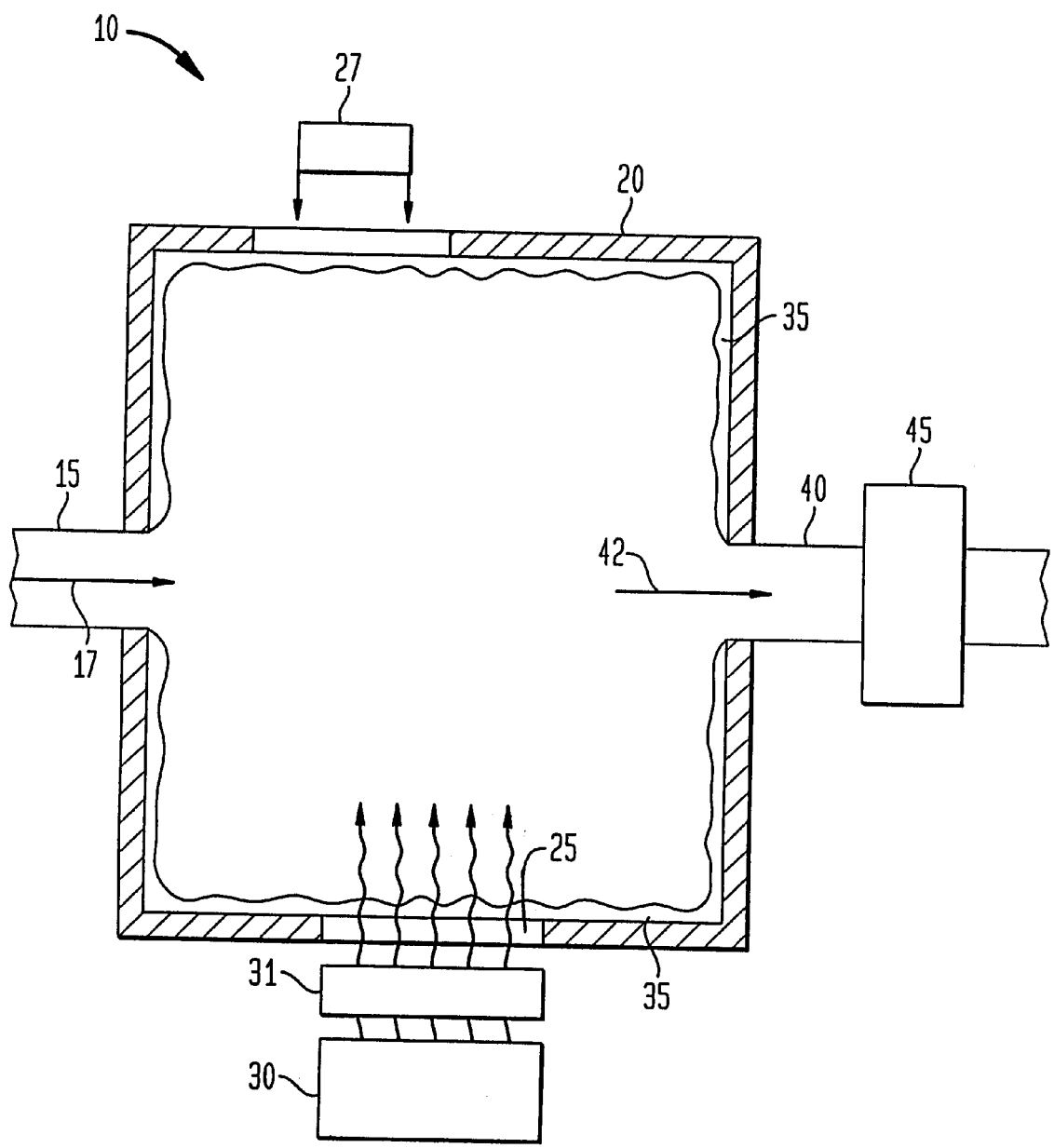
FIG. 1 is a cross-sectional schematic view of an embodiment of the present invention for cleaning a windowed semiconductor processing chamber having photoresist contamination.

With reference to FIG. 1, one embodiment of the present invention is shown for cleaning a semiconductor processing chamber used for etching, or stripping or the combination of etching and stripping photoresist from wafers and thereby having photoresist contamination. The system 10 is comprised of the semiconductor processing chamber 20 having a window 25. While a wafer 27 is positioned outside the chamber 20, either before or after the wafer 27 is moved into the chamber 20 for processing, a flow of incoming gas 17 enters the chamber 20 thorough an inlet 15. A emitter 30 generating pulsed UV radiation is placed outside the chamber 20 but is aligned so that the UV radiation passes through the window 25, which may be quartz or other UV-transparent material, to enter the chamber 20. A focusing barrel 31, or other device known to those skilled in the art, may be optionally provided between the window 25 and the UV emitter 30 to improve the efficiency of UV transmission into the chamber 20 while the wafer 27 is outside the chamber 20. The UV emitter 30 may be a UV flashlamp, such as a xenon flashlamp or a pulsed mercury vapor lamp. The UV radiation is absorbed by the photoresist contamination 35, resulting in the heating of the contamination 35. The UV radiation converts the incoming gas 17 into a reactive agent which reacts with the heated photoresist to generate volatile products which are then removed from the chamber 20 an outflow of gas 42 exiting the chamber 20. When oxygen is used as the incoming gas 17, the UV radiation generates the highly reactive oxidizing agent ozone which reacts with the heated photoresist contamination 35 to volatilize the contamination 35 by forming low molecular weight volatile products, comprising for example, carbon dioxide and water. The volatile products, as well as any unreacted agent or incoming gas 17, comprise the gas stream 42 that exits the chamber 20 through the outlet 40. The gas stream 42 passes through a detector 45 to determine the composition of the exiting gas stream 42 or the presence or absence or the amount of a component of such gas stream 42. The detector 45 may comprise a carbon dioxide detector, gas chromatography, near-infrared spectrophotometry or other such detector known to those skilled in the art. For example, when air or preferably oxygen is used as the incoming gas 17, a detector 45 for determining whether a component of the volatile products, such as carbon dioxide, is present in the gas stream 42 can be used, since the detection of none or a sufficiently small quantity of such volatile product indicates that the reaction between the photoresist contamination 35 and the ozone is no longer occurring. This indicates that the photoresist contamination 35 has been sufficiently volatilized and is no longer present in the chamber 20 and accordingly, the cleaning process is complete. The detection of other products, such as water or unreacted ozone, in the gas stream 42 may also be evaluated by the detector 42 to determine sufficient completion of the cleaning of the chamber 20.

Figure 2:
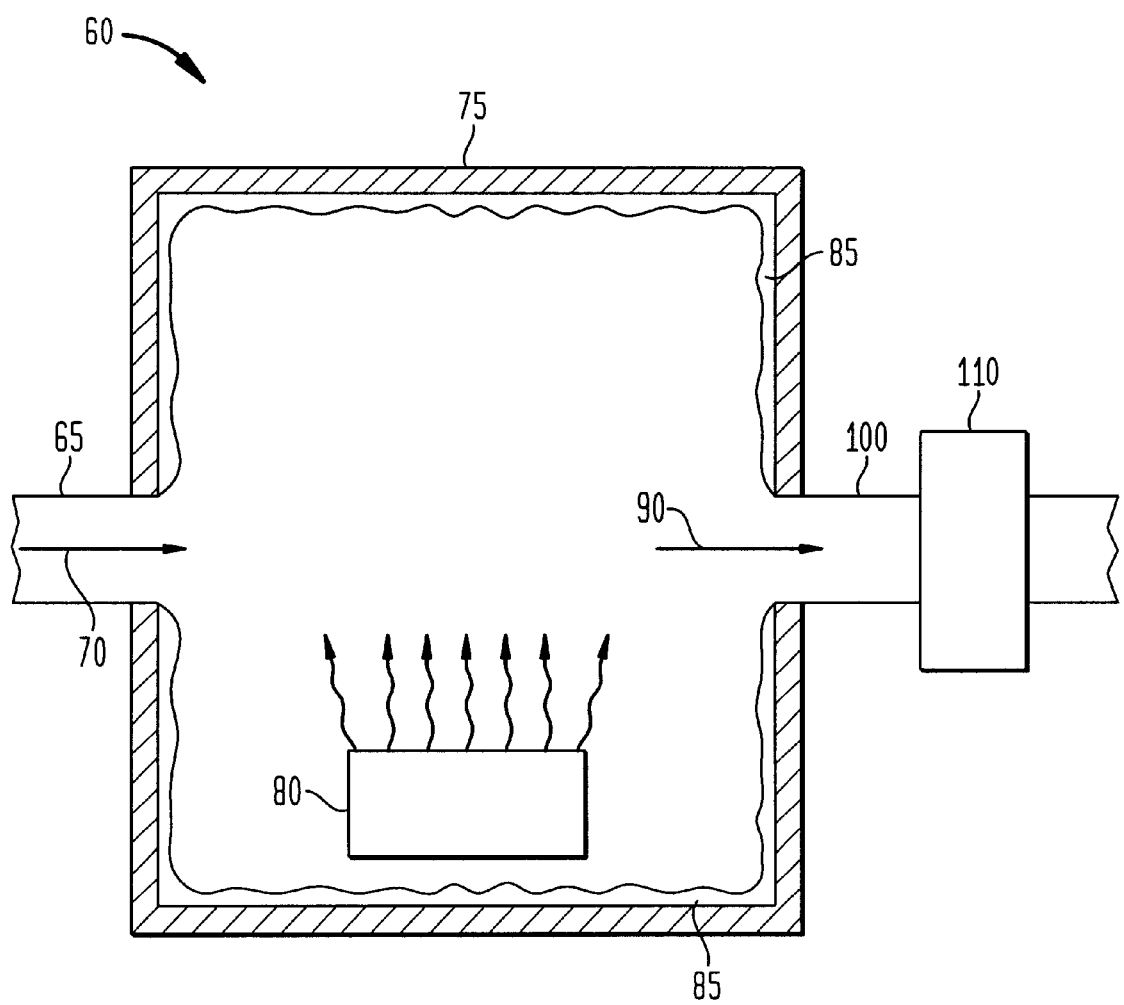
FIG. 2 is a cross-sectional schematic view of an embodiment of the present invention for cleaning a windowless semiconductor processing chamber having photoresist contamination.

In an alternative embodiment illustrated in FIG. 2, the present invention for cleaning a semiconductor processing chamber having photoresist contamination from etching, or stripping or the combination of etching and stripping photoresist from wafers is performed in a system 60 having a windowless semiconductor processing chamber 75. An emitter 80 generating pulsed UV radiation is placed directly inside the chamber 75. An incoming flow of gas 70, such as oxygen gas, enters the chamber 75 thorough an inlet 65. As in the previously described embodiment, the UV emitter 80 may be a UV flashlamp, such as a xenon flashlamp or a pulsed mercury vapor lamp or any other generator of pulsed UV radiation. The UV radiation is absorbed by the photoresist contamination 85, which is thereby heated. The UV radiation converts the incoming gas 70 into a reactive agent.

When oxygen is the incoming gas 70 used, the UV radiation generates the highly reactive oxidizing agent ozone which reacts with the heated photoresist contamination 85 to volatilize the contamination 85 by forming low molecular weight volatile products, comprising carbon dioxide and water. These volatile products form part of the gas stream 90 that exits the chamber 75 through the outlet 100. The gas stream 90 passes through a detector 110 which may be a carbon dioxide detector, gas chromatography, near-infrared spectrophotometry or other detector for determining whether a component of the volatile products, such as carbon dioxide, or unreacted agent, ozone, is present in the gas stream 90. The detection of none or a sufficiently small quantity of the volatile product or a large quantity of unreacted agent indicates that the reaction between the photoresist contamination 85 and the ozone is no longer occurring and the cleaning process is thus complete.

In the embodiments illustrated in FIGS. 1 and 2, the semiconductor wafers processed in the chambers 20 and 75, respectively, can either be kept outside or can be inside the chambers 20 and 75 during cleaning, provided that appropriate steps are taken to shield such wafers from any electrostatic discharge (ESD) that may be generated by the UV emitters 30 and 80, respectively. ESD-shielded wafers inside the chamber 20 and 75 during cleaning are themselves cleaned during the cleaning process and chamber downtime is reduced. Referring to FIG. 1, an indium-tin oxide clear, conductive coating on the window 25 or on a quartz tube or on a separately inserted window between the emitter 30 and any wafers located inside the chamber 20 or any exposed wafers outside the chamber 20 could be used to shield the wafers from any ESD that might originate from the UV emitter 30. Similarly, referring to FIG. 2, the emitter 80 inside the chamber 75 can be enveloped by quartz coated with indium tin oxide so that wafers inside the chamber 75 are shielded from any ESD that may originate from the emitter 80. Likewise, any wafers outside the chamber would also be shielded from any such ESD generated by such enveloped emitter 80.

While the invention has been described and illustrated in connection with preferred embodiments, many variations and modifications as will be evident to those skilled in this art may be made without departing from the spirit and scope of the invention, and the invention is thus not to be limited to the precise details of methodology or construction set forth above as such variations and modification are intended to be included within the scope of the invention.

What is claimed is:

1. A method for cleaning a semiconductor processing chamber having photoresist contamination, comprising the steps of:
   providing an electrostatic discharge shield;
   flowing gas into the chamber; and
   emitting pulses of ultraviolet light into the chamber thereby converting the photoresist contamination to volatile products.

2. The method of claim 1 further comprising the steps of:
   detecting the volatile products in a downstream gas flow; and
   repeating the steps until a specific level of volatile products is detected in the downstream gas flow.

3. The method of claim 2 wherein the detecting step comprises gas chromatography.

4. The method of claim 2 wherein the detecting step comprises near infra-red spectrophotometry.

5. The method of claim 1 wherein the emitting step includes converting the gas to reactive agent and preferentially heating the photoresist contamination with the ultraviolet light.

6. The method of claim 5 wherein the emitting step includes reacting the agent with the heated photoresist thereby converting the heated photoresist contamination to volatile products.

7. The method of claim 6 wherein the volatile products comprise carbon dioxide.

8. The method of claim 5 wherein the flowing gas comprises oxygen and the reactive agent comprises ozone.

9. The method of claim 1 wherein the emitting step comprises pulsing an ultraviolet light generating photoflash lamp.

10. The method of claim 9 wherein the photoflash lamp is a xenon photoflash lamp.

11. The method of claim 1 wherein the chamber does not contain a wafer.

12. The method of claim 1 wherein the electrostatic discharge shield comprises a clear, conductive coating.

13. The method of claim 12 wherein the clear conductive coating comprises a coating of indium-tin oxide.

14. The method of claim 12 wherein the pulses of ultraviolet light are transmitted through a window on which the clear, conductive coating is deposited.

15. The method of claim 12 wherein the ultraviolet light is transmitted through a quartz tube on which the clear, conductive coating is deposited.

* * * * *